(12) United States Patent  
Saito

(10) Patent No.: US 6,259,329 B1  
(45) Date of Patent: Jul. 10, 2001

(54) REFERENCE-FREQUENCY-SIGNAL SWITCHING CIRCUIT

(75) Inventor: Shingo Saito, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/453,767

(22) Filed: Dec. 2, 1999

(30) Foreign Application Priority Data

Dec. 14, 1998 (JP) .................................................. 10-354692

(51) Int. Cl.$^7$ ................................ H03B 5/32; H03B 5/36
(52) U.S. Cl. ...................... 331/49; 331/116 R; 331/158; 331/173; 327/298
(58) Field of Search ........................ 331/46, 49, 108 C, 331/116 R, 116 FE, 117 R, 117 FE, 158, 173; 327/152, 298

(56) References Cited

U.S. PATENT DOCUMENTS 5,453,719 * 9/1995 Narahara ................................ 331/49

FOREIGN PATENT DOCUMENTS 3-235517 10/1991 (JP) .
6-244697 9/1994 (JP) .

* cited by examiner

Primary Examiner—David Mis  
(74) Attorney, Agent, or Firm—Brinks Hofer Gilson & Lione

(57) ABSTRACT

A reference-frequency-signal switching circuit includes an internal reference-frequency-signal oscillator for generating an internal reference-frequency signal, a reference-frequency-signal input terminal to which an external reference-frequency signal is input, a reference-frequency-signal output terminal, and a reference-frequency-signal output switching section. In the reference-frequency-signal output switching section, when the external reference-frequency signal is not input to the reference-frequency-signal input terminal, the internal reference-frequency-signal oscillator is set to an active state and the internal reference-frequency signal output from the internal reference-frequency-signal oscillator is sent to the reference-frequency-signal output terminal; and when the external reference-frequency signal is input to the reference-frequency-signal input terminal, the internal reference-frequency-signal oscillator is set to an inactive state and the external reference-frequency signal is sent to the reference-frequency-signal output terminal. The reference-frequency-signal output switching section is provided with a band-pass filter for extracting the proper external reference-frequency signal.

2 Claims, 2 Drawing Sheets

REFERENCE-FREQUENCY-SIGNAL SWITCHING CIRCUIT

BACKGROUND OF THE INVENTION

1. Field of the Invention

The present invention relates to reference-frequency-signal switching circuits, and more particularly, to a reference-frequency-signal switching circuit which selectively outputs either the internal reference-frequency signal generated by an internal reference-frequency-signal oscillator or the reference-frequency signal generated by an external reference-frequency-signal oscillator and which stops the operation of the internal reference-frequency-signal oscillator when the external reference-frequency signal is output.

2. Description of the Related Art

In a cable television (CATV) transmitter, a reference-frequency-signal switching circuit for sending a reference-frequency signal to a reference-frequency-signal source in a head end has been conventionally used.

This reference-frequency-signal switching circuit includes an internal reference-frequency-signal oscillator for generating a reference-frequency signal in its inside. The reference-frequency-signal switching circuit selectively outputs the reference-frequency signal output from the internal reference-frequency-signal oscillator or a reference-frequency signal input externally.

FIG. 2 shows an outlined structure of a conventional reference-frequency-signal switching circuit.

As shown in FIG. 2, the conventional reference-frequency-signal switching circuit is formed of an internal reference-frequency-signal oscillator 21, a reference-frequency-signal input terminal 22, a reference-frequency-signal output terminal 23, a detection circuit 24, a relay 25 having one circuit with two contacts, and a power source terminal 26.

The internal reference-frequency-signal oscillator 21 generates an internal reference-frequency signal having a reference frequency, for example, a frequency of 10 MHz. The internal reference-frequency-signal oscillator 21 is connected between the power source terminal 26 and the ground, and its output end is connected to one fixed contact of the relay 25. At the reference-frequency-signal input terminal 22, an external reference-frequency signal having the reference frequency, for example, a frequency of 10 MHz, is given externally. The reference-frequency-signal input terminal 22 is connected to the input end of the detection circuit 24 and to the other fixed contact of the relay 25. Either the internal reference-frequency signal or the external reference-frequency signal is selectively sent to the reference-frequency-signal output terminal. The terminal is connected to a movable contact of the relay 25. The detection circuit 24 detects the external reference-frequency signal input to the input end, and generates a DC driving voltage at the output end. Its output end is connected to one end of the driving coil of the relay 25. In the relay 25, the other end of the driving coil is grounded.

The reference-frequency-signal switching circuit having the above structure operates in the following way.

In a period when the external reference-frequency signal is not input to the reference-frequency-signal input terminal 22, since the external reference-frequency signal is not sent to the input end of the detection circuit 24 and the DC driving voltage is not generated at the output end of the detection circuit 24, the driving coil of the relay 25 is not driven and the movable contact of the relay 25 is switched to one fixed contact side as shown by a solid line in FIG. 2. The internal reference-frequency signal generated by the internal reference-frequency-signal oscillator 21 is sent to the reference-frequency-signal output terminal 23 from the output end of the internal reference-frequency-signal oscillator 21 through the switched contact of the relay 25. The internal reference-frequency signal having a frequency of 10 MHz is taken out at the reference-frequency-signal output terminal 23.

In a period when the external reference-frequency signal is input to the reference-frequency-signal input terminal 22, since the external reference-frequency signal is sent to the input end of the detection circuit 24 and the DC driving voltage is generated at the output end of the detection circuit 24, the driving coil of the relay 25 is driven and the movable contact of the relay 25 is switched to the other fixed contact side as shown by a dotted line in FIG. 2. The external reference-frequency signal input to the reference-frequency-signal input terminal 22 is sent to the reference-frequency-signal output terminal 23 through the switched contact of the relay 25. The external reference-frequency signal having a frequency of 10 MHz is taken out at the reference-frequency-signal output terminal 23.

As described above, the conventional reference-frequency-signal switching circuit automatically switches the output of the reference-frequency signal such that the internal reference-frequency signal generated by the internal reference-frequency-signal oscillator 21 is output when the external reference-frequency signal is not input to the reference-frequency-signal input terminal 22 and the external reference-frequency signal is output unmodified when the external reference-frequency signal is input to the reference-frequency-signal input terminal 22.

In the conventional reference-frequency-signal switching circuit, when the input external reference-frequency signal is output unmodified, since the internal reference-frequency-signal oscillator 21 operates to output the internal reference-frequency signal, a part of the internal reference-frequency signal may be combined for some reason with the external reference-frequency signal being output. In this case, although the external reference-frequency signal having a frequency of 10 MHz and the internal reference-frequency signal having a frequency of 10 MHz have the identical frequency, if a frequency difference occurs even slightly between them, a beat happens between the two reference-frequency signals. This beat component reduces the quality of the output reference-frequency signal. In addition, since the internal reference-frequency-signal oscillator 21 is operating unnecessarily, power consumption increases.

In the conventional reference-frequency-signal switching circuit, only when the external reference-frequency signal is input, the contact of the relay 25 is switched and the input external reference-frequency signal is output. Since the external reference-frequency signal is sent or is not sent to the reference-frequency-signal input terminal 22 usually by a manual operation, even if an external signal other than the determined external reference-frequency signal is erroneously input to the reference-frequency-signal input terminal 22, the detection circuit 24 responds to the signal and the contact of the relay 25 is switched to output the signal from the reference-frequency-signal output terminal 23.

SUMMARY OF THE INVENTION

Accordingly, it is an object of the present invention to provide a reference-frequency-signal switching circuit which always outputs a high-quality external reference-frequency signal or a high-quality internal reference-frequency signal selectively and which reduces power consumption.

Another object of the present invention is to provide a reference-frequency-signal switching circuit which, when a signal other than the desired one is erroneously input to a reference-frequency-signal input terminal, does not respond to the input signal and does not output the input signal.

One of the foregoing objects is achieved in one aspect of the present invention through the provision of a reference-frequency-signal switching circuit including an internal reference-frequency-signal oscillator for generating an internal reference-frequency signal; a reference-frequency-signal input terminal to which an external reference-frequency signal is input; a reference-frequency-signal output terminal; and a reference-frequency-signal output switching section for setting the internal reference-frequency-signal oscillator to an active state and for sending the internal reference-frequency signal output from the internal reference-frequency-signal oscillator to the reference-frequency-signal output terminal when the external reference-frequency signal is not input to the reference-frequency-signal input terminal, and for setting the internal reference-frequency-signal oscillator to an inactive state and for sending the external reference-frequency signal to the reference-frequency-signal output terminal when the external reference-frequency signal is input to the reference-frequency-signal input terminal.

The reference-frequency-signal switching circuit may be configured such that the reference-frequency-signal output switching section includes a first switching transistor connected to a power-source circuit of the internal reference-frequency-signal oscillator and a second switching transistor for controlling the on and off states of the first switching transistor; and the first switching transistor is set to the on state and the second switching transistor is set to the off state when the external reference-frequency signal is not input, and the first switching transistor is set to the off state and the second switching transistor is set to the on state when the external reference-frequency signal is input.

The reference-frequency-signal switching circuit may be configured such that the reference-frequency-signal output switching section includes a first switching diode connected between the reference-frequency-signal input terminal and the reference-frequency-signal output terminal, and a second switching diode connected between the internal reference-frequency-signal oscillator and the reference-frequency-signal output terminal; and the first switching diode is set to the off state and the second switching diode is set to the on state when the external reference-frequency signal is not input, and the first switching transistor is set to the on state and the second switching transistor is set to the off state when the external reference-frequency signal is input.

According to the present invention, in a reference-frequency-signal switching circuit, when an external reference-frequency signal is not input to the reference-frequency-signal input terminal, the internal reference-frequency-signal oscillator is set to an active state to generate the internal reference-frequency signal and the internal reference-frequency signal output from the internal reference-frequency-signal oscillator is sent to the reference-frequency-signal output terminal; and when an external reference-frequency signal is input to the reference-frequency-signal input terminal, the internal reference-frequency-signal oscillator is set to an inactive state so as not to generate the internal reference-frequency signal and the input external reference-frequency signal is sent to the reference-frequency-signal output terminal unmodified. In other words, since the internal reference-frequency signal is not generated while the external reference-frequency signal is being output, the external reference-frequency signal is not combined with the internal reference-frequency signal, a beat between both signals is prevented from being generated, and a high-quality reference-frequency signal is always output. In addition, since the oscillation enabled condition and the oscillation disabled condition are selectively switched in the internal reference-frequency-signal oscillator, power consumption is reduced as compared with a case in which the internal reference-frequency-signal oscillator is continuously operated.

One of the foregoing objects is achieved in another aspect of the present invention through the provision of the above reference-frequency-signal switching circuit in which the reference-frequency-signal output switching section includes a band-pass filter having a pass band at the external reference frequency.

According to the present invention, in the reference-frequency-signal switching circuit, since the band-pass filter passes a signal input to the reference-frequency-signal input terminal only when it is the predetermined external reference-frequency signal, even if another signal is erroneously input, the signal is not output and thereby a circuit which uses the output reference-frequency signal is prevented from malfunctioning.

DESCRIPTION OF THE PREFERRED EMBODIMENT

Figure 1:
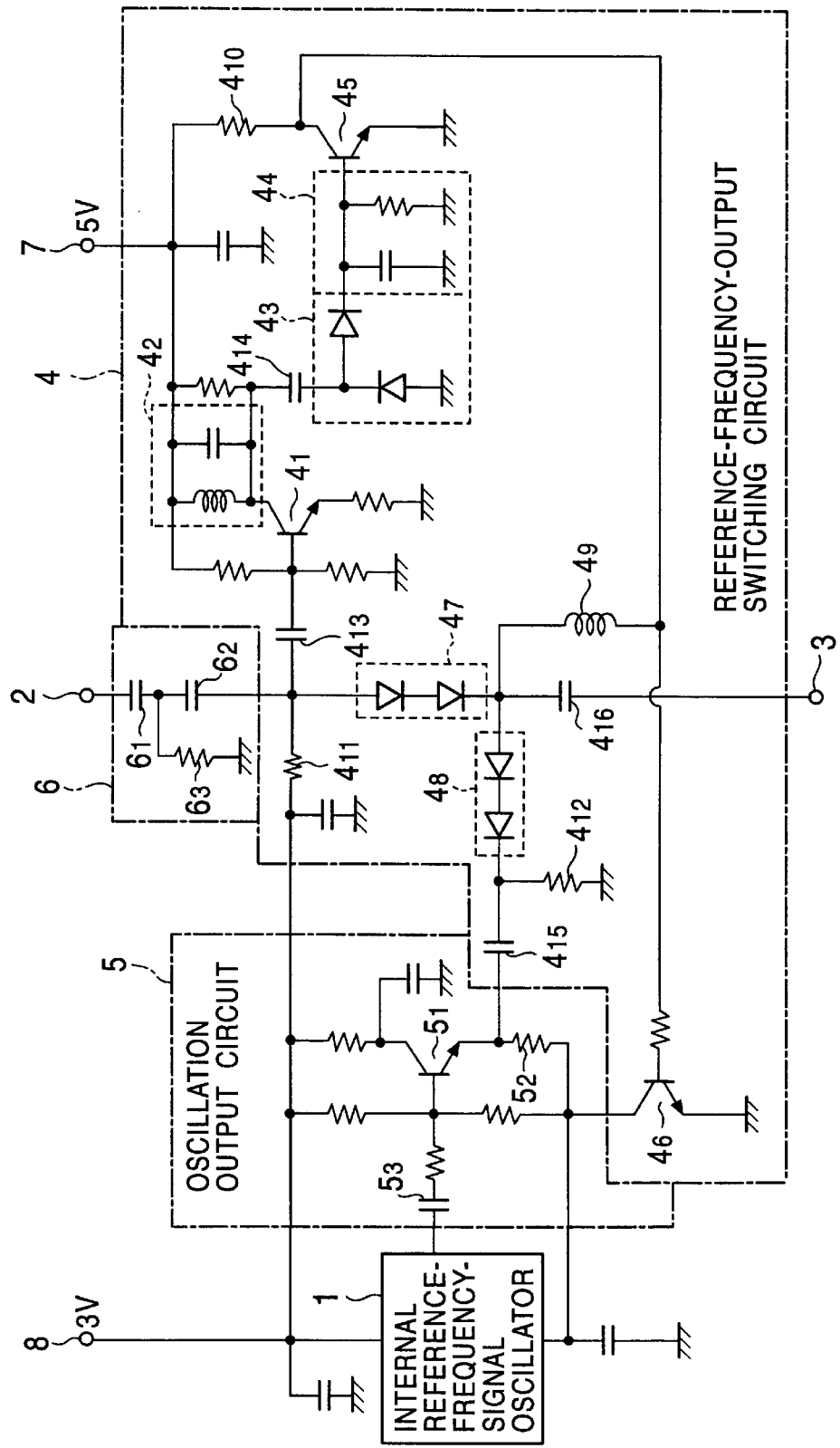
FIG. 1 is a circuit diagram of a reference-frequency-signal switching circuit according to an embodiment of the present invention.
Figure 2:
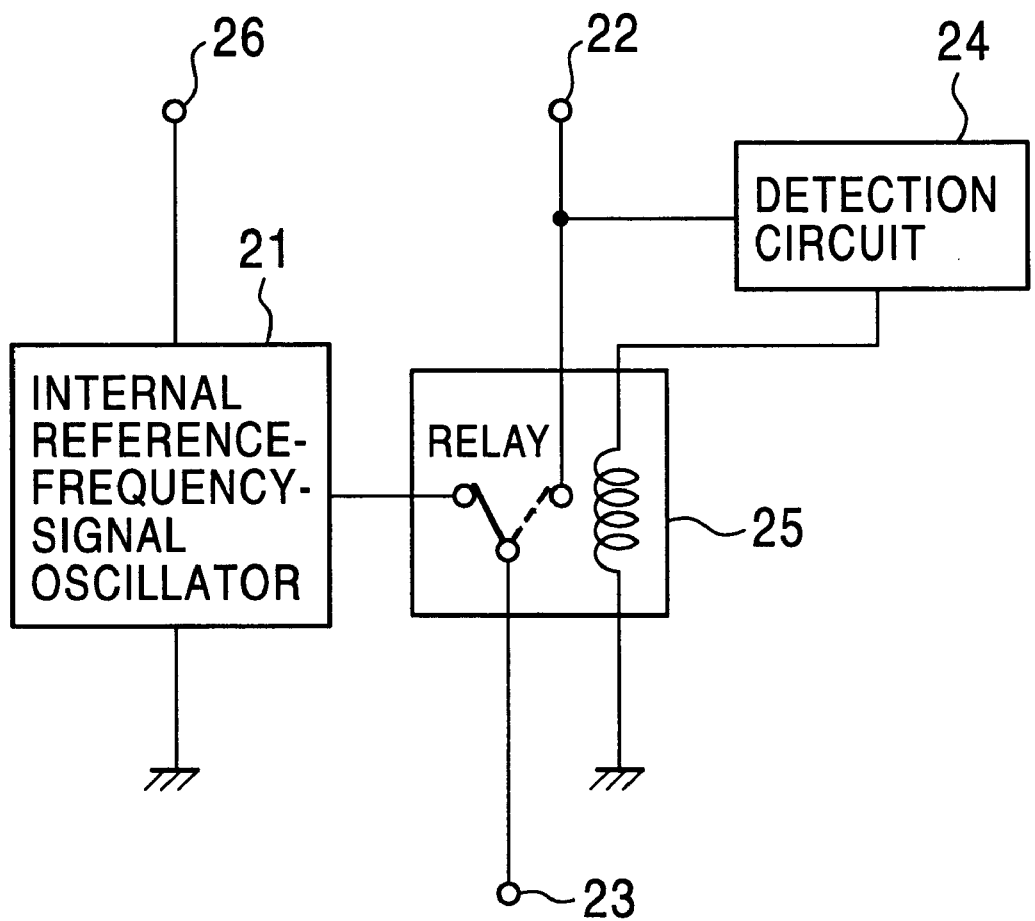
FIG. 2 is an outlined structural view of a conventional reference-frequency-signal switching circuit.

An embodiment of the present invention will be described below by referring to the drawings.

FIG. 1 is a circuit diagram of a reference-frequency-signal switching circuit according to an embodiment of the present invention.

As shown in FIG. 1, the reference-frequency-signal switching circuit of the present embodiment is formed of an internal reference-frequency-signal oscillator 1, a reference-frequency-signal input terminal 2, a reference-frequency-signal output terminal 3, a reference-frequency-signal output switching section 4, an oscillation output circuit 5, a signal input circuit 6, a high-voltage power source terminal 7, and a low-voltage power source terminal 8.

The reference-frequency-signal output switching section 4 includes an input transistor $4_1$, a band-pass filter $4_2$, a detection circuit $4_3$, a smoothing circuit $4_4$, a second switching transistor $4_5$, a first switching transistor $4_6$, a first switching diode circuit $4_7$, a second switching diode circuit $4_8$, an inductor $4_9$, a collector resistor $4_{10}$, bias resistors $4_{11}$ and $4_{12}$, and coupling capacitors $4_{13}$, $4_{14}$, $4_{15}$, and $4_{16}$. The oscillation output circuit 5 includes a transistor $5_1$, an emitter load resistor $5_2$, and a coupling capacitor $5_3$. The signal input circuit 6 has coupling capacitors $6_1$, and $6_2$ and a shunt resistor $6_3$.

In the internal reference-frequency-signal oscillator 1, its output end is connected to the input end of the oscillation output circuit 5, its power-source end is connected to the low-voltage power-source terminal 8, and its ground end is connected to the collector of the switching transistor $4_6$, described later. The reference-frequency-signal input terminal 2 is connected to the input end of the signal input circuit 6, and the reference-frequency-signal output terminal 3 is connected to the output end of the reference-frequency-signal output switching section 4.

In the reference-frequency-signal output switching section 4, the emitter of the input transistor $4_1$, is grounded through a resistor, and the base thereof is connected to a first input end of the reference-frequency-signal output switching section 4 through the coupling capacitor $4_{13}$ and is also connected to two base bias resistors. The input transistor $4_1$ operates as a grounded-emitter transistor. The band-pass filter $4_2$ is formed of a parallel resonant circuit of an inductor and a capacitor, passes an external reference-frequency signal, and is connected between the collector of the input transistor $4_1$ and a high-voltage power-source line connected to the high-voltage power-source terminal 7. The detection circuit $4_3$ is formed of a series diode and a shunt diode. The input end thereof is connected to the collector of the input transistor $4_1$ through the coupling capacitor $4_{13}$, and the output end thereof is connected to the input end of the smoothing circuit $4_4$. The smoothing circuit $4_4$ is formed of a capacitor and a resistor shunt-connected. The output end thereof is connected to the base of the switching transistor $4_5$. The collector of the switching transistor $4_5$ is connected to the high-voltage power-source line through the collector resistor $4_{10}$, and the emitter thereof is directly grounded. The switching transistor $4_5$ operates as a grounded-emitter transistor. The collector of the switching transistor $4_6$ is connected to the ground end of the internal reference-frequency-signal oscillator 1 and to the other end of the emitter load resistor $5_2$ of the oscillation output circuit 5, the base thereof is connected to the collector of the switching transistor $4_5$ through a resistor, and the emitter thereof is directly grounded. The switching transistor $4_6$ operates as a grounded-emitter transistor. The first diode circuit $4_7$ is formed of two series-connected diodes. One end thereof is connected to the first input end of the reference-frequency-signal output switching section 4, and the other end is connected to the output end of the reference-frequency-signal output switching section 4 through the coupling capacitor $4_{16}$. The second diode circuit $4_8$ is formed of two series-connected diodes. One end thereof is connected to a second input end of the reference-frequency-signal output switching section 4 through the coupling capacitor $4_{15}$, and the other end is connected to the output end of the reference-frequency-signal output switching section 4 through the coupling capacitor $4_{16}$. One end of the inductor $4_9$ is connected to the other ends of the two diode circuits $4_7$ and $4_8$, and the other end of the inductor is connected to the collector of the switching transistor $4_5$. One end of the bias resistor $4_{11}$ is connected to the low-voltage power-source terminal 8, and the other end thereof is connected to the first input end of the reference-frequency-signal output switching section 4. One end of the bias resistor $4_{12}$ is connected to one end of the second diode circuit $4_8$ and the other end of the bias resistor is grounded.

In the oscillation output circuit 5, the collector of the transistor $5_1$ is connected to the low-voltage power-source terminal 8 through a resistor, the base thereof is connected to the input end of the oscillation output circuit 5 through a resistor and the coupling capacitor $5_3$, and the emitter thereof is connected to one end of the emitter load resistor $5_2$ and to the output end of the oscillation output circuit 5.

In the signal input circuit 6, the coupling capacitors $6_1$ and $6_2$ are connected in series between the input end and the output end of the signal input circuit 6. The one end of the shunt resistor $6_3$ is connected to the connection point of the coupling capacitors $6_1$ and $6_2$, and the other end is grounded.

The reference-frequency-signal switching circuit according to the present embodiment operates in the following way.

When an external reference-frequency signal is not input to the reference-frequency-signal input terminal 2, since the external reference-frequency signal is not sent to the input end of the reference-frequency-signal output switching section 4, a positive detection voltage is not output from the detection circuit $4_3$ and the switching transistor $4_5$ is turned off. Then, a positive high voltage (5V) supplied to the high-voltage power-source terminal 7 is sent to the base of the switching transistor $4_6$ through the collector resistor $4_{10}$, and simultaneously to the other end of the first diode circuit $4_7$ and the other end of the second diode circuit $4_8$, through the collector resistor $4_{10}$ and the inductance $4_9$. The switching transistor $4_6$ is turned on and the ground end of the internal reference-frequency-signal oscillator 1 is grounded through the switching transistor $4_6$. Therefore, a normal power-source voltage of 3V is supplied to the internal reference-frequency-signal oscillator 1 and the oscillator 1 generates the internal reference-frequency signal. Since the positive low voltage (3V) supplied to the low-voltage power-source terminal 8 is sent to the one end of the first diode circuit $4_7$, the two diodes become reversely biased. The first diode circuit $4_7$ is turned off and the reference-frequency-signal input terminal 2 is separated from the reference-frequency-signal output terminal 3. On the other hand, since the one end of the second diode circuit $4_8$ is grounded through the bias resistor $4_{12}$, the two diodes are forward-biased and the second diode circuit $4_8$ is turned on. The internal reference-frequency signal output from the internal reference-frequency-signal oscillator 1 is amplified by the transistor $5_1$ in the oscillation output circuit 5, and is sent to the reference-frequency-signal output terminal 3 through the second diode circuit $4_8$ which is in the on state and the coupling capacitor $4_{16}$. The internal reference-frequency signal is output from the reference-frequency-signal output terminal 3 to a circuit which uses the signal.

When the external reference-frequency signal is input to the reference-frequency-signal input terminal 2, the external reference-frequency signal input to the input end of the reference-frequency-signal output switching section 4 is extracted by the band-pass filter $4_2$, the extracted external reference-frequency signal is detected by the detection circuit $4_3$, and a positive detection voltage is output from the detection circuit $4_3$. An unnecessary fluctuating component is removed from this positive detection voltage in the smoothing circuit $4_4$, and the voltage is sent to the base of the switching transistor $4_5$ to turn on the transistor $4_5$. In this case, the collector of the switching transistor $4_5$ is close to the ground voltage. This close-to-ground voltage is sent to the base of the switching transistor $4_6$, and simultaneously to the other end of the first diode circuit $4_7$ and the other end of the second diode circuit $4_8$ through the collector resistor $4_{10}$ and the inductor $4_9$. The switching transistor $4_6$ is turned off due to the close-to-ground voltage and thereby, the ground end of the internal reference-frequency-signal oscillator 1 becomes open. Therefore, the normal power-source voltage of 3 V is not supplied to the internal reference-frequency-signal oscillator 1, and the internal reference-frequency-signal oscillator 1 stops generating the internal reference-frequency signal. Since the positive low voltage (3

V) supplied to the low-voltage power-source terminal 8 is applied to the one end of the first diode circuit 4$_7$ and the close-to-ground voltage is applied to the other end, the two diodes are forward biased. The first diode circuit 4$_7$ is turned on and the reference-frequency-signal input terminal 2 is connected to the reference-frequency-signal output terminal 3. On the other hand, since the one end of the second diode circuit 4$_8$ is grounded through the bias resistor 4$_{12}$ and the close-to-ground voltage is applied to the other end, the two diodes are reverse biased, and the second diode circuit 4$_8$ is turned off. The external reference-frequency signal input to the reference-frequency-signal input terminal 2 is sent to the reference-frequency-signal output terminal 3 through the signal input circuit 6, the first diode circuit 4$_7$ which is in the on state, and the coupling capacitor 4$_{16}$. The external reference-frequency signal is output from the reference-frequency-signal output terminal 3 to a circuit which uses the signal.

As described above, according to the reference-frequency-signal switching circuit of the present embodiment, when the external reference-frequency signal is not input to the reference-frequency-signal input terminal 2, the internal reference-frequency-signal oscillator 1 is set to an active state to generate the internal reference-frequency signal and the internal reference-frequency signal output from the internal reference-frequency-signal oscillator 1 is sent to the reference-frequency-signal output terminal 3; and when the external reference-frequency signal is input to the reference-frequency-signal input terminal 2, the internal reference-frequency-signal oscillator 1 is set to an inactive state so as not to generate the internal reference-frequency signal and the input external reference-frequency signal is sent to the reference-frequency-signal output terminal 3 unmodified. In other words, since the internal reference-frequency signal is not generated while the external reference-frequency signal is being output, the external reference-frequency signal is not combined with the internal reference-frequency signal, a beat between both signals is prevented from being generated, and a high-quality reference-frequency signal is always output. In addition, since the oscillation enabled condition and the oscillation disabled condition are selectively switched in the internal reference-frequency-signal oscillator 1, power consumption is reduced as compared with a case in which the internal reference-frequency-signal oscillator 1 is continuously operated.

According to the reference-frequency-signal switching circuit of the present embodiment, since the reference-frequency-signal output switching section 4 is provided with the band-pass filter 4$_2$, which extracts the external reference-frequency signal, only when the proper external reference-frequency signal is input to the reference-frequency-signal input terminal 2, the input external reference-frequency signal is sent to the reference-frequency-signal output terminal 3. Therefore, even if a signal other than the proper external reference-frequency signal is erroneously input to the reference-frequency-signal input terminal 2, that erroneously input signal is not output from the reference-frequency-signal output terminal 3.

In the above embodiment, the reference-frequency-signal switching circuit having the structure shown in FIG. 1 is used as an example. The circuit structure of a reference-frequency-signal switching circuit according to the present invention is not limited to that structure. Any reference-frequency-signal switching circuit which implements the same function can, of course, be used.

What is claimed is:
1. A reference-frequency-signal switching circuit comprising:

an internal reference-frequency-signal oscillator generating an internal reference-frequency signal;

a reference-frequency-signal input terminal to which an external reference-frequency signal is input;

a reference-frequency-signal output terminal; and a reference-frequency-signal output switching section setting said internal reference-frequency-signal oscillator to an active state and sending the internal reference-frequency signal output from said internal reference-frequency-signal oscillator to said reference-frequency-signal output terminal when the external reference-frequency signal is not input to said reference-frequency-signal input terminal, and setting said internal reference-frequency-signal oscillator to an inactive state and sending the external reference frequency signal to said reference-frequency-signal output terminal when the external reference-frequency signal is input to said reference-frequency-signal input terminal, wherein said reference-frequency-signal output switching section comprises:
a first switching transistor connected with a power-source circuit contained in said internal reference-frequency-signal oscillator,
a second switching transistor controlling on and off states of the first switching transistor,
a first switching diode connected between said reference-frequency-signal input terminal and said reference-frequency-signal output terminal,
a second switching diode connected between said internal reference-frequency-signal oscillator and said reference-frequency-signal output terminal, and
a detection circuit provided between said reference-frequency-signal input terminal and a base of said second switching transistor, a collector of the second switching transistor is connected to a high-voltage power source terminal and a base of the first switching transistor, an emitter of the first switching transistor and an emitter of the second switching transistor are grounded, the internal reference-frequency-signal oscillator connected to a low-voltage power source terminal, a first end of the first and second switching diodes connected with said reference-frequency-signal output terminal are also connected with the collector of the second switching transistor through an inductor, an end of the internal reference-frequency-signal oscillator connected with ground and with a collector of the first switching transistor, a third transistor is connected between an output end of the internal reference-frequency-signal oscillator and a second end of the second switching diode, a base of the third transistor is connected with the output end of the internal reference-frequency-signal oscillator, and an emitter of the third transistor is connected with the collector of the first switching transistor through an emitter load resistor, when the external reference-frequency signal is not input, the first switching transistor is set to the on state and the second switching transistor is set to the off state, when the external reference-frequency signal is input, the first switching transistor is set to the off state and the second switching transistor is set to the on state by a detection voltage from the detection circuit, and the first switching diode is set to the off state and the second switching diode is set to the on state when the external reference-frequency signal is not input, and the first switching transistor is set to the on state and the second switching transistor is set to the off state when the external reference-frequency signal is input.

2. A reference-frequency-signal switching circuit according to claim 1, wherein said reference-frequency-signal output switching section comprises a band-pass filter having a pass band at the external reference frequency and provided between the reference-frequency-signal input terminal and the detection circuit.

* * * * *